United States Patent [19]

Diepeveen

[11] 3,975,143

[45] Aug. 17, 1976

[54] MECHANISM FOR INCREMENTAL MOVEMENT OF VERTICAL FRAME

[76] Inventor: John C. Diepeveen, 1737 Kimberly Drive, Sunnyvale, Calif. 94087

[22] Filed: Sept. 5, 1974

[21] Appl. No.: 503,531

Related U.S. Application Data

[62] Division of Ser. No. 342,231, March 16, 1973, Pat. No. 3,858,784.

[52] U.S. Cl. .................................. 432/5; 219/162; 228/242; 432/11
[51] Int. Cl.² ..................... F27D 5/00; F27D 13/00
[58] Field of Search .............. 219/162; 432/5, 6, 11; 228/227, 228, 230, 231, 232, 240, 242

[56] References Cited
UNITED STATES PATENTS

| | | | |
|---|---|---|---|
| 1,673,226 | 6/1968 | Bushell et al. | 219/162 |
| 2,583,968 | 1/1952 | Rosseau | 432/11 |

*Primary Examiner*—John J. Camby
*Attorney, Agent, or Firm*—Townsend and Townsend

[57] ABSTRACT

Apparatus for incrementally moving a planar frame, such as a die support frame used in the manufacture of semiconductor components. The apparatus includes means for mounting a frame for movement in a vertical plane past a heater element, whereby portions of the frame can be successively heated by the heater element to permit bonding of die to leads terminating at the upper margin of the frame. The frame is incrementally moved by one or more horizontally reciprocal pawls, each pawl being receivable within an opening in the frame during a feed stroke of the pawl and being cammed out of such opening during a return stroke thereof. A first clamp releasably clamps the frame to the heater element during a die bonding operation and moves away from the heater element at the end of the return stroke and during the feed stroke. One or more drag clamps releasably clamp the lower margin of the frame against a support during the return stroke and through a major portion of the feed stroke, the drag clamps moving away from the support during the latter part of the feed stroke to permit the frame to gravitate if it has elevated during the feed stroke.

4 Claims, 7 Drawing Figures

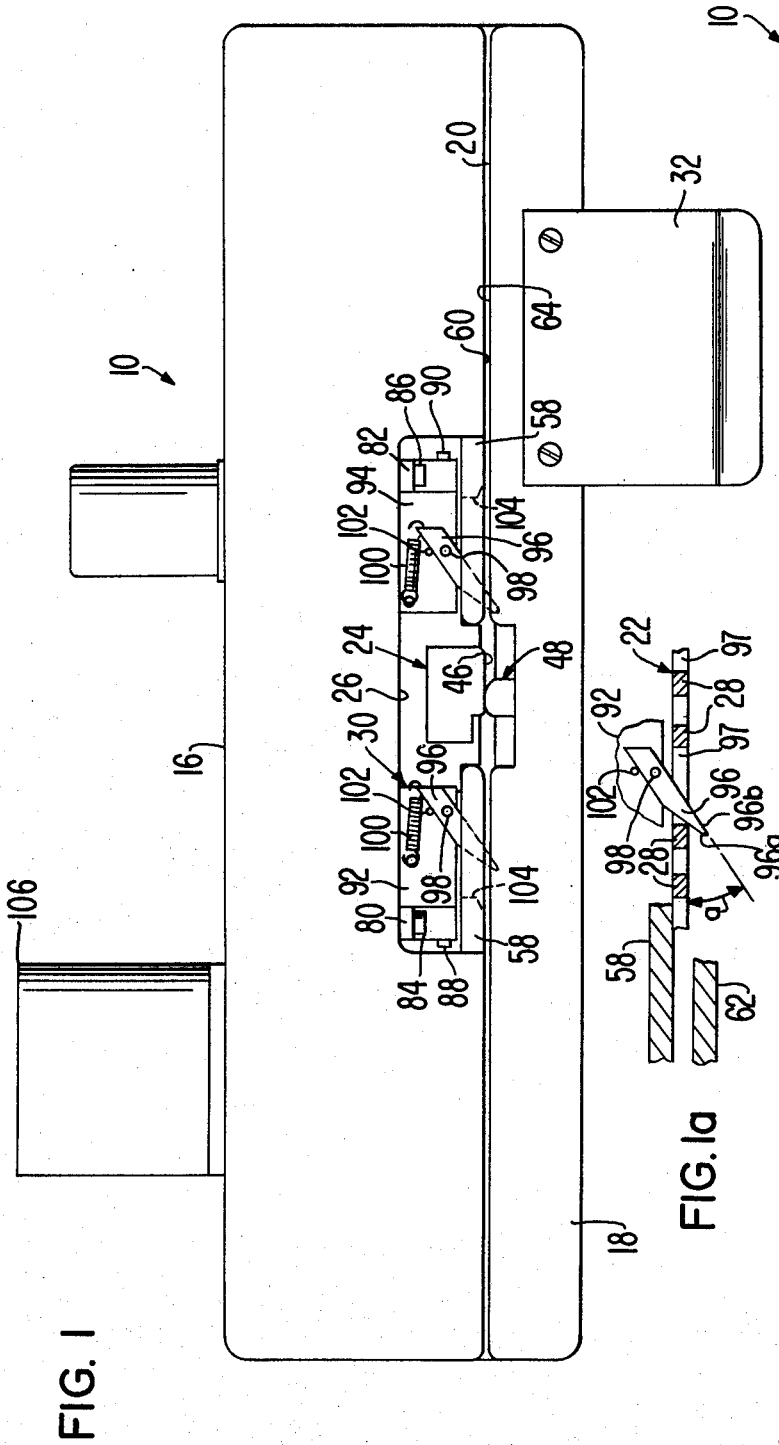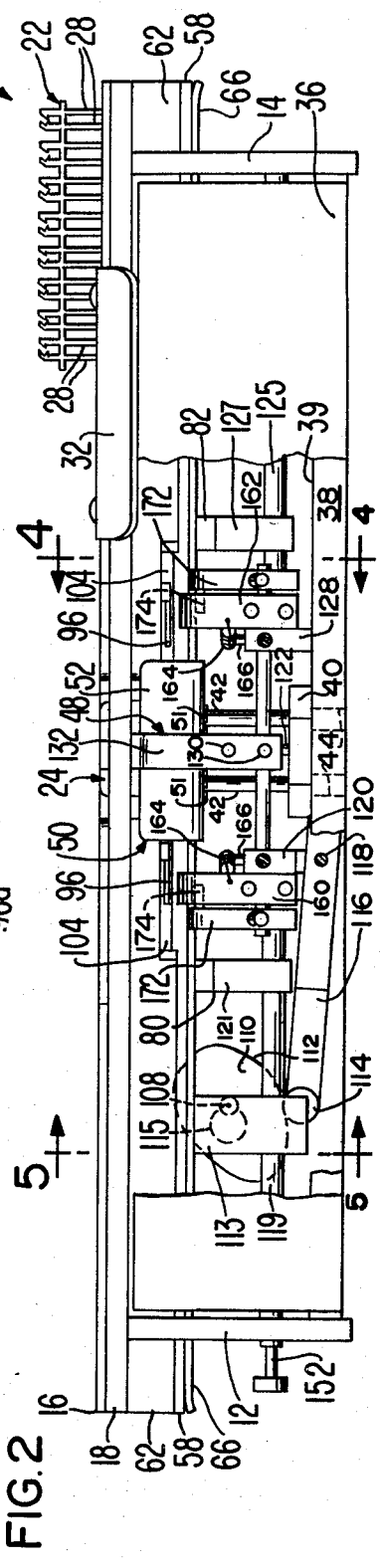

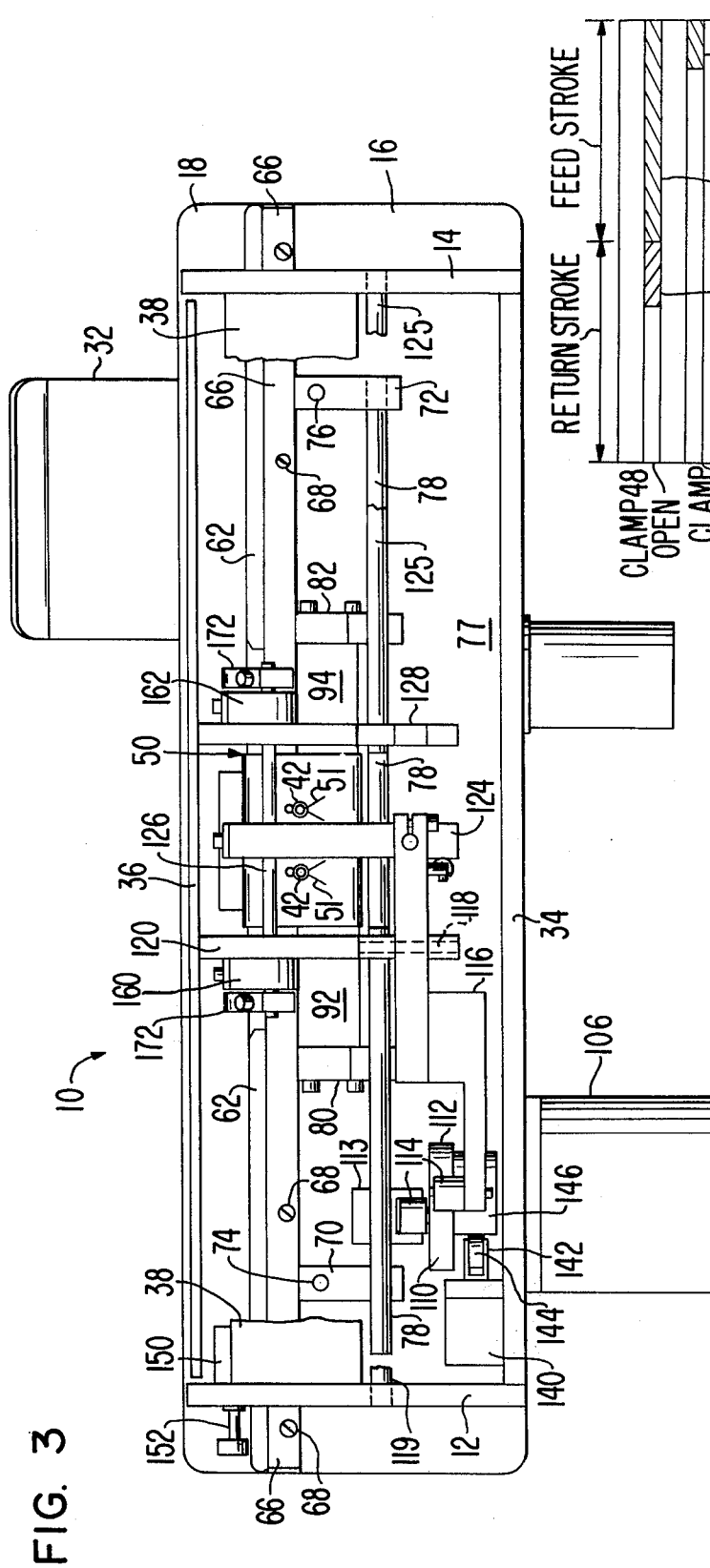
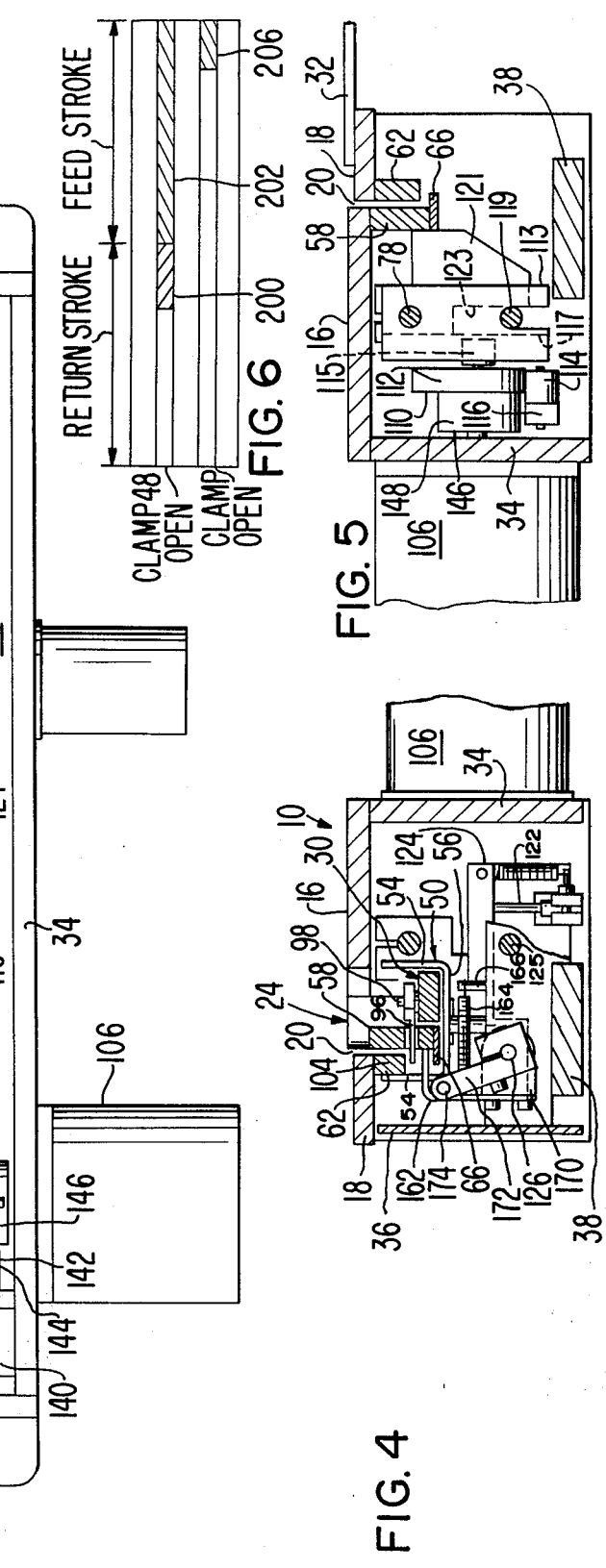

MECHANISM FOR INCREMENTAL MOVEMENT OF VERTICAL FRAME

This is a division of application Ser. No. 342,231, filed Mar. 16, 1973 now U.S. Pat. No. 3,858,784.

This invention relates to the handling of generally planar frames, such as die support frames used in the manufacture of semiconductor components and, more particularly, to apparatus for incrementally moving such a frame past a reference point while the frame is vertically disposed.

BACKGROUND OF THE INVENTION

In the manufacture of semiconductor components, such as diodes, transistors and integrated circuits, semiconductor chips or die are secured to die support frames by being bonded thereto after the frame has been heated. Generally, a number of frame portions which are to receive the die are heated by moving the frame so that the frame portions are successively moved into thermal interchange relationship with a heater element. In some frames, the pads or regions which receive the die are located centrally of the frame and leads extend outwardly from the pads. In such a case, the frame is horizontally disposed when the frame portions are heated by the heater element. This is accomplished by moving the frame over the heater element.

In other applications, the frame has leads terminating at one side margin of the frame and it is at the ends of each pair of such leads that a die is to be bonded. In such a case, it is most advantageous to orient the frame in a vertical plane so that the upper extremity of the frame defines the side margin thereof to which the die are to be attached. A need has, therefore, arisen to provide apparatus for supporting a frame of this type in a vertical plane and to move the frame incrementally past a heater element, whereby successive portions of the frame can be heated to permit die bonding operations to be carried out with the frame.

SUMMARY OF THE INVENTION

This invention relates to an apparatus for satisfying the above need yet assures complete control of the frame at all times during bonding operations therewith. Control of the frame is especially important because of the tendency of a planar frame, when disposed in a vertical frame, to be elevated slightly when it is moved in a horizontal direction by a force applied above its lower margin. If the frame is moved incrementally, the cumulative effect of the individual elevations is that the frame will rise too much and be out of the proper position with respect to a certain reference. Moreover, the frame must be clamped against movement during the time when the drive means reverses, i.e., during a return stroke thereof. Otherwise, the frame could possibly move rearwardly with the drive means and thereby be dislocated relative to the reference, rendering the apparatus inoperable for its intended purpose.

The present invention overcomes the aforesaid problems by the use of one or more drag clamps releasably engageable with the frame in a manner and for a time sufficient to achieve control of the frame during both forward and reverse movement of the drive means. Specifically, the clamps hold the frame stationary during reverse movement of the drive means and apply drag forces to the frame during only a portion of the forward movement of the drive means. However, the frame moves forwardly notwithstanding the drag forces thereon. During the remainder of the forward movement, the drag clamps are out of engagement with the frame, thus allowing it to continue its forward movement to descend to the support therebeneath if, in fact, it has risen during the forward movement.

The foregoing feature assures that the frame will be properly oriented relative to a heater element at one side of the vertical plane of the frame. Thus, successive portions of the frame will move into and out of heat exchange relationship to the heater element so that semiconductor chips or die can be successively bonded to the upper extremities of the frame portions.

The frame is generally formed with spaced leads defining openings therethrough. The frame drive means of the apparatus of this invention includes one or more reciprocal pawls adapted to enter the openings at the end of the reverse movement of the drive means and to advance the frame forwardly during the forward movement of the drive means. The control of the frame is provided by the drag clamps during such forward and reverse movements and assures that the openings of the frame will at all times be properly oriented so that the pawls will readily enter the openings at the end of each reverse movement of the drive means. Thus, there will be no malfunction of the pawls or damage to the frame due to improper alignment of the openings relative to the pawls.

Another feature of the invention is the provision of a frame support which orients the frame in a vertical plane yet allows for some slight bowing or crookedness of the frame. Each pawl is shaped and mounted in an operative position such that the leading edge of the pawl forms an acute angle with the plane of the frame. Thus, such leading edge, when it engages the frame during forward movement thereof, prevents lateral movement of the frame and thereby overcomes any tendency of the frame to move suddenly to the side which might cause a die just previously bonded to the frame to be flipped off the same during forward movement thereof.

The primary object of this invention is to provide an improved apparatus for supporting a die support in a vertical plane and for incrementally moving the frame past a heater element in a manner to control the movement of the frame so that it is presented properly to the heater element at all times notwithstanding the tendency for the frame to be elevated relative to its support therebeneath during its forward movement to thereby assure substantially automatic movement of the frame without the need for operator attention.

Another object of this invention is to provide apparatus of the type described wherein the apparatus utilizes a reciprocal pawl for entering an opening in the frame during a return stroke and for driving the frame in a forward direction during a feed stroke while at the same time clamp means applies a holding force to the frame during the return stroke and a drag force to the frame for at least a major portion of the feed stroke to assure that control of the frame is maintained at all times yet the frame is allowed to gravitate to an equilibrium position if, during the feed stroke, the frame rises slightly due to the fact that the moving force applied to the frame is exerted above the lower margin thereof.

A further object of this invention is to provide an apparatus of the aforesaid character wherein the pawl is shaped to prevent lateral movement of the frame during a feed stroke so that a die bonded to the frame at the upper margin thereof will not be thrown off the frame such as by a sudden lateral movement of the frame due to one or more causes.

Still another object of this invention is to provide apparatus of the type described wherein the frame is incrementally moved automatically by the actuation of a drive means which is cycled successively and, during each cycling step, causes the frame to be advanced through an incremental distance, whereby a number of different portions of the frame can be successively moved into heat exchange relationship to a heater element adjacent to one side of the frame to permit the bonding of semiconductor chips or die to respective terminals at the upper margin of the frame.

Other objects of this invention will become apparent as the following specification progresses, reference being had to the accompanying drawings for an illustration of the apparatus.

In the drawings:

FIG. 1 is a top plan view of the die frame supporting and moving apparatus of this invention;

FIG. 1a is an enlarged, fragmentary, cross-sectional view of the apparatus showing the way in which a reciprocal pawl advances a die frame in one direction;

FIG. 2 is a front elevational view of the apparatus, parts being broken away to illustrate details of construction;

FIG. 3 is a bottom plan view of the apparatus, parts being broken away to illustrate details of construction;

FIG. 4 is a cross-sectional view taken along line 4—4 of FIG. 2;

FIG. 5 is a cross-sectional view taken along line 5—5 of FIG. 2; and

FIG. 6 is a timing chart showing the time intervals in which several frame clamps are in engagement with and disengaged from a frame carried by the apparatus.

The apparatus of this invention is broadly denoted by the numeral 10 and includes a base comprised of a pair of upright, generally parallel end walls 12 and 14 (FIGS. 2 and 3) which are secured to the lower surfaces of a pair of generally horizontal top plates 16 and 18 FIGS. 1, 4 and 5). Plates 16 and 18 are spaced apart as shown in FIGS. 1 and 5 to present a gap 20 therebetween for receiving a generally planar die support frame 22 when the latter is disposed in a generally vertical plane. Frame 22, when manually inserted into the gap at the upstream end thereof, i.e., the right end thereof when viewing FIG. 1, and when coupled to frame drive means 30 hereinafter described, is adapted to be incrementally moved through gap 20 past a heater element 24 disposed in a recess 26 in plate 16 as shown in FIG. 1. An operator successively places integrated circuit chips at the upper margins of portions of frame 22 which are successively moved into engagement with heater element 24. Such upper margins of the frame portions are defined by the upper ends of respective pairs of spaced leads 28 (FIGS. 1a and 2), whereby the chips will be bonded to such upper ends due to the heat generated in the frame portions by heater element 24. A handrest 32 is provided for the operator's benefit, the handrest being secured by screws to plate 18 and extending laterally therefrom.

Heater element 24 extends into a region below plates 16 and 18. This region is substantially surrounded by end walls 14 and a pair of opposed, parallel sidewalls 34 and 36 (FIGS. 3 and 4). A bottom crosspiece 38 (FIGS. 2–5) is secured to and spans the distance between end walls 12 and 14. Crosspiece 38 has an upper surface 39 (FIG. 2) to which a bracket 40 is secured for adjustably mounting a pair of tubular posts 42 which extend upwardly from the bracket. Heater element 24 is mounted on the upper ends of posts 42 and can be adjusted in height by adjusting posts 42 relative to bracket 40. Crosspiece 38 has a pair of holes 44 (FIG. 2) therethrough aligned with posts 42 to increase the distance by which the posts can be lowered. Also, holes 44 allow air to pass through posts 42 for cooling purposes.

As shown in FIG. 1, heater element 24 has a generally flat face 46 against which successive portions of frame 22 are to engage so as to be heated thereby. A central clamp 48 (FIGS. 1 and 2) releasably holds each frame portion against face 46.

A U-shaped heat shield 50 of reflective material, such as a suitable metal, is carried on posts 42 to reflect heat energy radiated to the side by heater element 24. To this end, heat shield 50 has a pair of opposed parallel sides 54 (FIG. 4) beneath and spaced from respective top plates 16 and 18 and integral with a bottom 56 which rests loosely on cotter pins 52 passing through respective posts 42; thus, there is a minimum of heat conduction from the posts to heat shield 50.

Plate 16 has a pair of spaced, horizontally aligned guide rails 58 which are secured to and depend from side margin 60 of the plate adjacent to and on one side of gap 20 (FIG. 1). Rails 58 are spaced apart to accommodate heater element 24 therebetween as shown in FIG. 1.

Top plate 18 has a pair of spaced rails 62 secured to and depending from side margin 64 thereof on the opposite side of gap 20 from rail 58. Rails 58 and 62 define guides for frame 22 when the latter is disposed within gap 20. The width of gap 20 and the distance between corresponding rails 58 and 62 are generally greater than the basic width of frame 22. This feature allows the frame to be movable through the gap even though the frame is not truly flat, such as when it is slightly bent or bowed at one or more locations thereon. A rigid strip 66 (FIGS. 4 and 5) is secured by screws 68 to the lower, flat faces of rails 58. Strip 66 provides a support on which frame 22 rests and is slidable when the frame is disposed in gap 20 in a vertical plane.

Plate 16 is provided with a pair of bearing blocks 70 and 72 (FIG. 3) secured by screws 74 and 76 to its lower surface 77 slightly inwardly of end walls 12 and 14. Bearing blocks 70 and 72 shiftably mount a horizontal shaft 78 for reciprocal movement with respect to plate 16. Shaft 78 has a pair of spaced brackets 80 and 82 (FIGS. 1 and 3) releasably clamped thereto by screws 84 and 86, (FIG. 1) respectively, brackets 80 and 82 being secured by screws 88 and 90, respectively, to the end faces of a pair of rigid plates 92 and 94, respectively, which project toward each other as shown in FIG. 1 and are cantilevered on respective brackets 80 and 82. Shaft 78, brackets 80 and 82, and plates 92 and 94 form parts of drive means 30.

Each of plates 92 and 94 is provided with a pawl 96 (FIG. 1) pivotally mounted by a vertical pin 98 on the upper surface of the corresponding plate, the pawl being biased by a coil spring 100 in a counterclockwise sense when viewing FIG. 1 toward and against a stop pin 102 carried by the plate. The length of each pawl 96 is sufficient to cause it to extend through a slot 104 (FIGS. 1 and 2) extending into the corresponding rail 58 from the inner end thereof. Thus, each pawl projects normally across the vertical plane in which gap 20 lies.

Each pawl has a leading edge 96a which converges with a trailing edge 96b to form a point, the latter adapted to be inserted within a space 97 (FIG. 1a) between adjacent pairs of leads 28 of frame 22 when the pawl has moved in reverse, i.e., to the right when viewing FIG. 1, during a "return stroke". When the pawl is in opening 97, it is in the proper position for advancing frame 22 forwardly during a "feed stroke". As shown in FIG. 1a, leading edge 96a makes an acute angle with the plane of frame 22. Thus, the frame is held against lateral movement between guide rails 58 and 62 during the feed stroke even though the thickness of the frame is less than the distance between rails 58 and 62.

Shaft 78 and thereby brackets 80 and 82 are reciprocated by operation of a stepping motor 106 (FIGS. 1, 3 and 4) carried by sidewall 34 and projecting laterally therefrom. The drive shaft 108 (FIG. 2) of motor 106 has a cam 110 provided with a cam surface 112 which normally engages a roller 114 on a first lever 116 pivotally mounted by a pin 118 on a first bearing plate 120 transverse to and mounted on crosspiece 38. The opposite end of lever 116 has a rod 122 (FIG. 4) adjustably and pivotally mounted thereon and extending upwardly therefrom, the upper end of pin 122 being pivotally received within a recess (not shown) in the lower flat face of a second lever 124 extending transversely of first lever 116. Second lever 124 extends toward and is rigidly connected to a horizontal shaft 126 which spans the distance between and is rotatably mounted on first bearing plate 120 and a second bearing plate 128 (FIG. 2) parallel to first bearing plate 120 and secured to crosspiece 38. Clamp 48 is secured by screws 130 to an end face of lever 124 on the side of shaft 126 opposite to the side on which rod 122 is disposed. Clamp 48 has an inclined finger 134 at its upper end which extends across the upper margin of the adjacent side 54 of heat shield 50 and toward face 46 of heater element 24 as shown in FIG. 1. Finger 134 is adapted to clamp a portion of frame 22 against face 46 of heater element 24.

A bracket 113 (FIGS. 2, 3 and 5) is clamped to shaft 78 and is coupled to cam 110 by a roller 115 eccentrically mounted on the cam relative to drive shaft 108 (FIG. 2). Roller 115 is slidably received within a guideway 117 (FIGS. 3 and 5) and moves vertically in the same direction as the cam rotates under the influence of drive motor 106 and as bracket 113 reciprocates horizontally under the influence of the rotation of roller 115 about the axis of drive shaft 108. Thus, bracket 113 causes shaft 78 to reciprocate in response to the operation of motor 106.

A first guide shaft 119 (FIGS. 2, 3 and 5) spanning the distance between end wall 12 and first bearing plate 120 is slidably engaged by and guides the lower end of bracket 113 (FIG. 5) as it reciprocates and prevents it from rotating about the axis of shaft 78. As shown in FIG. 5, bracket 113 is bifurcated to receive shaft 119. Moreover, bracket 80 (FIG. 5) has a lower portion 121 provided with a vertical surface 123 which slidably bears against and is guided by shaft 119 as bracket 80 reciprocates under the influence of shaft 78.

A second guide shaft 125 (FIGS. 2, 3 and 4) spans the distance between second bearing plate 128 and end wall 14 and is axially aligned with and serves a similar purpose as shaft 119. Shaft 125 guides the lower portion 127 (FIG. 2) of bracket 82 and prevents it from rotating about the axis of shaft 78.

A limit switch 140 (FIGS. 3 and 5) secured to the inner surface of sidewall 34 has an actuator arm 142 provided with a roller 144 which bears against the cylindrical outer surface 146 of a sleeve 148 mounted on drive shaft 108. Switch 140 forms a part of an electrical circuit (not shown) which limits the rotation of drive shaft 108 to a single revolution at the end of which motor 106 is deactuated. A push-button switch 150 having a plunger 152 (FIG. 3) is provided for manual operation of motor 106. Switch 150 could also take the form of a foot-actuated switch, if desired.

An important feature of the present invention is the way in which the lower margin of frame 22 is provided with a drag force during a portion of the time in which the frame is moved incrementally to the left when viewing FIGS. 1 and 2 under the influence of pawls 96. To this end, a pair of L-shaped drag clamps 160 and 162 (FIGS. 2 and 4) are rotatably mounted on shaft 126 at the ends thereof outboard of bearing blocks 120 and 128 (FIG. 2). A coil spring 164 is provided for each drag clamp, respectively, the spring being connected at one end to a respective drag clamp and to the opposite end to a post 166 (FIG. 4) secured to and extending upwardly from the adjacent bearing block (FIG. 2). Thus, the drag clamps are biased in a clockwise sense when viewing FIG. 4 about shaft 126, each drag clamp being secured by screws (FIG. 4) to a bracket 170 freely rotatable on shaft 126. As shown in FIG. 4, the illustrated drag clamp normally bears against the lower margin of the adjacent rail 58 when frame 22 is not in an operative position in gap 20. When frame 22 is in the gap, each drag clamp forces it into frictional engagement with the adjacent rail 58. Also, drag clamps 160 and 162 cooperate with central clamp 48 to hold the frame against rearward movement in gap 20 as pawls 96 move through their return stroke.

Each drag clamp has an actuating lever 172 immediately adjacent thereto. Each lever 172 has a lateral pin 174 (FIG. 2) which extends toward the drag clamp and is adapted to engage the vertical portion thereof and to rotate the drag clamp in a counter-clockwise sense when viewing FIG. 4 when lever 172 is rotated under the influence of shaft 126. Initially, each pin 174 is spaced from the vertical portion of the corresponding drag clamp. Thus, the drag clamp does not rotate until shaft 126 has rotated through a predetermined arc. Each lever is adjustably connected to shaft 126; thus, the spacing between each pin 174 and the corresponding drag clamp can be varied. In this way, it is possible to delay the rotation of the drag clamps relative to that of shaft 126 as desired. Moreover, this feature permits central clamp 48 to be rotated out of engagement with the upper part of the frame as drag clamps 160 and 162 continue to clamp the lower part of the frame to rails 58.

OPERATION

Apparatus 10 is initially placed on a supporting surface and motor 106 and heater element 24 are coupled to a source of electrical power. A die support frame 22 is inserted in gap 20 at the entrance end, i.e., the right-hand end when viewing FIGS. 1 and 2. The frame is caused to rest on strip 66 and then is moved to the left until the right-hand pawl 96 (FIG. 1) extends through the first space 97. In this position of the frame, the first pair of leads will usually be out of alignment with face 46 of heater element 24. Thus, the frame will be moved incrementally to the left when motor 106 is cycled one or more times until the first pair of leads 28 are aligned with face 46 of heater element 24.

Each time the motor is cycled, cam 110 rotates through one revolution and, as it does, rotates roller 115 which, in turn, moves bracket 113 and thereby shaft 78 to the right (viewing FIG. 3) through a first distance, then to the left through a second distance, and finally again to the right through a third distance. The first distance is selected so that it is greater than the third distance but is less than the second distance. During the movement of shaft 78, both pawls 96 are shifted accordingly. During the initial cycling of motor 106, the right-hand pawl is normally out of space 97 and remains so during its return stroke until it is free to enter the next space 97 which it does under the influence of its spring 100. It enters space 97 at the end of its return stroke. Then, shaft 78 moves to the left and the pawl inserted into a space 97 drives the frame to the left during the feed stroke until the next pair of leads 28 move into alignment with face 46 of heater element 24. Then, to complete the cycling of the motor, each pawl is then returned to a position about three-fourths of the way through its return stroke, at which time motor 106 is deactuated by the action of switch 140 (FIG. 3) to await the next cycling step. During this wait perio, a bonding operation takes place wherein a die is bonded to the upper ends of the pair of leads aligned with face 46 of heater element 24.

During the initial portion of each cycling step, the pawls move to the right and central clamp 48 and drag clamps 160 and 162 remain in engagement with the frame, thus holding the frame against movement to the right such as by being frictionally engaged by the pawls. However, as the pawls approach the end of the return stroke, cam 110 causes lever 116 to rock through a small arc in a counterclockwise sense (viewing FIG. 2) about pin 118 so that central clamp 48 moves out of clamping relationship to the frame. Thus, the movement of the frame during the feed stroke is assured and central clamp 48 will not mar the surface of leads 28 as the frame moves. The opening of central clamp 48 is denoted by the darkened timing segment 200 (FIG. 6). Then, during the feed stroke, central clamp 48 is maintained out of clamping relationship to the frame as denoted by darkened timing segment 202.

Drag clamps 160 and 162 remain in clamping relationship to the frame at all times during the return stroke and through a major portion of the feed stroke. Finally, during the latter part of the feed stroke, drag clamps 160 and 162 open, i.e., they move out of clamping relationship to the frame as denoted by darkened timing segment 206. It is during this period that all three clamps are spaced from the frame; thus, the frame is allowed to gravitate onto strip 66 if, during the feed stroke, the frame had risen. In this way, the frame movement is under the control of the drag clamps at all times to assure that the frame will be properly oriented relative to heater element 24.

The delay in opening of the drag clamps is achieved by positioning the pins 174 on levers 172 a distance sufficient to prevent movement of the drag clamps until shaft 126 has rotated through a predetermined arc. The shape of the cam and its relationship to the motor drive shaft are chosen to achieve the movement of the drag clamps as mentioned above.

The foregoing steps of each cycle are repeated over and over again until the frame has moved incrementally past heater element 24. During the bonding of die to the left end portion of the frame, only the right-hand pawl will drive the frame. During the bonding of die to the central portion of the frame, both pawls will drive the frame. During the bonding of die to the right-hand frame portion, only the left-hand pawl will drive the frame.

What I claim is:

1. A method of handling a die support frame comprising: positioning the frame in a substantially vertical plane; advancing the frame through an incremental distance; applying a drag force to the frame as it moves through a first portion of said incremental distance; eliminating the drag force on the frame as the latter moves through a second portion of said incremental distance; heating a part of the frame after the frame is incrementally advanced; clamping the frame against movement as the same is being heated; and repeating the advancing, applying, heating and clamping steps.

2. A method as set forth in claim 1, wherein is included the step of holding the frame against lateral movement as the same is being advanced.

3. A method as set forth in claim 1, wherein said advancing step includes applying a generally horizontal force to the frame at a location adjacent to and spaced above the lower margin thereof, said clamping step including applying a clamping force to said frame below said location.

4. A method of handling a die support frame comprising: positioning the frame in a substantially vertical plane; advancing the frame through an incremental distance; applying a drag force to the frame as it moves through a portion of said incremental distance; heating a part of the frame after the frame is incrementally advanced; clamping the frame against movement as the same is being heated; said clamping step including applying a first clamping force to the frame adjacent to the lower margin thereof and a second clamping force to the frame between the region of application of the first force and the upper margin of the frame.

* * * * *